(12) United States Patent
Borho et al.

(10) Patent No.: US 6,414,459 B1
(45) Date of Patent: Jul. 2, 2002

(54) METHOD FOR INFLUENCING THE ELECTRICAL POWER OF A LOAD WITH A PULSE WIDTH MODULATED SIGNAL

(75) Inventors: Lothar Borho, Willstaett; Karl-Heinrich Preis, Buehlertal, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/581,932
(22) PCT Filed: Dec. 4, 1998
(86) PCT No.: PCT/DE98/03566
§ 371 (c)(1),
(2), (4) Date: Sep. 29, 2000
(87) PCT Pub. No.: WO99/33161
PCT Pub. Date: Jul. 1, 1999

(30) Foreign Application Priority Data

Dec. 18, 1997 (DE) .......................................... 197 56 461

(51) Int. Cl.⁷ .............................. H02P 7/06; H02P 3/08
(52) U.S. Cl. ........................ 318/599; 318/434; 318/254; 318/257
(58) Field of Search ................................ 318/560–696; 388/812, 811, 813, 816, 819, 829, 831; 363/40, 41

(56) References Cited

U.S. PATENT DOCUMENTS

| 4,471,283 | A | | 9/1984 | Presley |
|---|---|---|---|---|
| 4,599,548 | A | * | 7/1986 | Schultz |
| 4,926,104 | A | | 5/1990 | King et al. |
| 4,978,865 | A | * | 12/1990 | Hartmann et al. |
| 5,406,150 | A | * | 4/1995 | Austin |
| 5,440,215 | A | * | 8/1995 | Gilmore |
| 5,689,162 | A | * | 11/1997 | Li |
| 5,708,343 | A | * | 1/1998 | Hara et al. |
| 5,712,550 | A | * | 1/1998 | Boll et al. |

FOREIGN PATENT DOCUMENTS

EP          0 735 660          10/1996

* cited by examiner

Primary Examiner—Paul Ip
(74) Attorney, Agent, or Firm—Kenyon & Kenyon

(57) ABSTRACT

A method is proposed for influencing the electrical power of a load with the assistance of a pulse-width modulated signal, the latter including the requirement of a continuous turn-on signal. The method provides that the continuous turn-on signal is terminated by an interrupt signal and that the continuous turn-on signal is followed by a clock-pulse phase having at least one fundamental period duration of the pulse-width modulated signal, the period including a turn-off time. The occasional interruption of the pulse-width modulated signal, which is present as the continuous turn-on signal, makes it possible to detect an operational quantity of the load that only arises during a power change in the load.

11 Claims, 1 Drawing Sheet

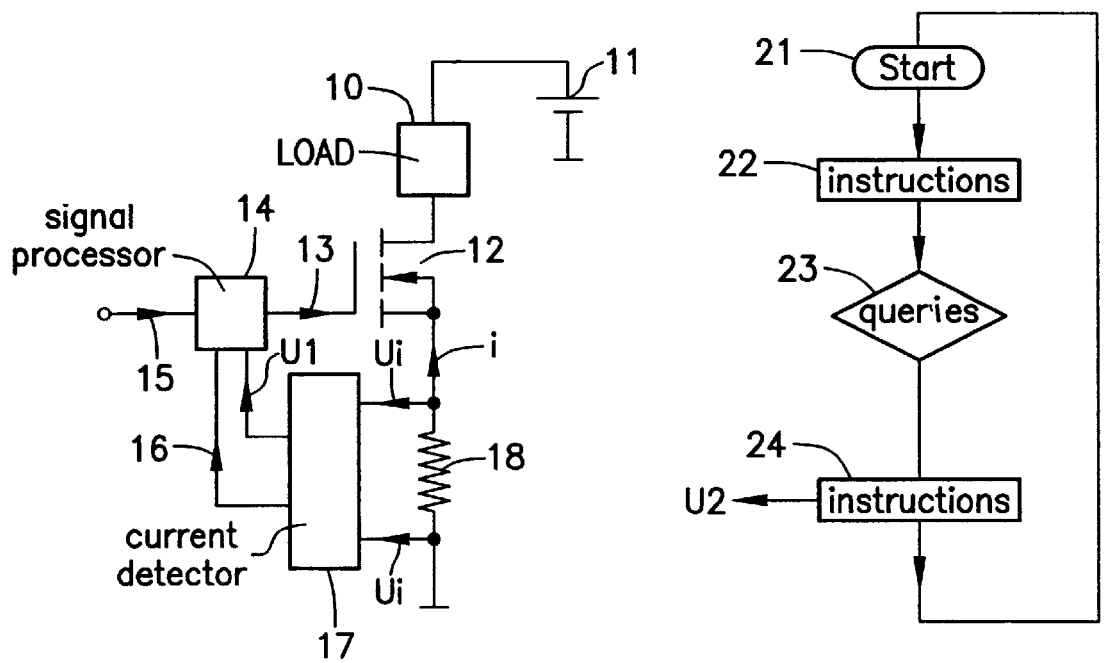
Fig. 1
Fig. 2
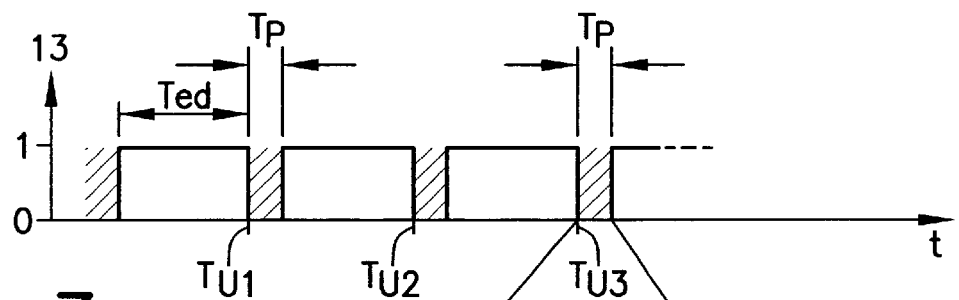
Fig. 3
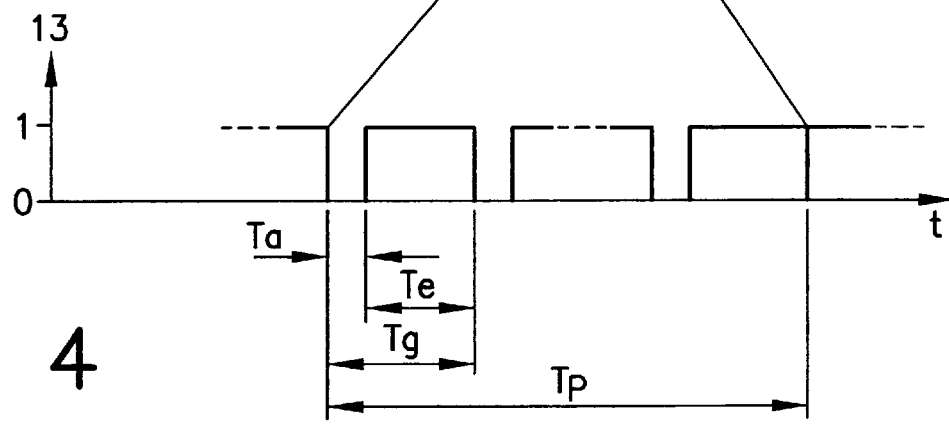
Fig. 4

METHOD FOR INFLUENCING THE ELECTRICAL POWER OF A LOAD WITH A PULSE WIDTH MODULATED SIGNAL

BACKGROUND INFORMATION

The present invention relates to a method for influencing the electrical power of a load with the assistance of a pulse-width modulated signal. From the textbook by L. Retzbach, "Speed Controllers," Neckar Printing House, Villingen-Schwenningen, 2nd edition, 1982, a method is described for influencing the electrical power of DC-current electromotors with the assistance of a pulse-width modulated signal. On pages 21–24, a principle of speed regulation is described that includes a pulse-width modulator. A comparator designated as modulator compares a DC voltage, which is a measure for the setpoint value of the electrical power of the DC-electromotor, with an AC voltage, which supplies a sawtooth voltage generator. The time during which the DC voltage exceeds the AC voltage signal, determines, for example, the turn-on time. The duration of the fundamental period of the generated pulse-width modulated signal is set by the fundamental frequency of the sawtooth voltage generator. In the generation of the pulse-width modulated signal, two limiting cases can arise that are not described in greater detail in the cited literature. The limiting cases arise when the DC voltage consistently lies beneath or above the sawtooth-shaped voltage made available by the generator. In one operational case, no further turn-on times occur. The electromotor is then no longer supplied with current. In the other operational case, the pulse-width modulated signal changes into a continuous turn-on signal, so that the electromotor continually is fully supplied with current.

Protection of the electromotor against overloading and of the output-stage circuit against the occurrence of an overcurrent is provided by the motor current detector described on pages 83 and 84. One implementation provides for the evaluation of the voltage drop occurring on the contact-break distance of the output-stage switch during the turn-on time.

SUMMARY OF THE INVENTION

The present invention is based on the objective of indicating a method for influencing the electrical power of a load with the assistance of a pulse-width modulated signal, the latter including the requirement of a continuous turn-on signal, which makes possible the detection of an operational quantity of the load.

The method according to the present invention has the advantage that in stipulating a continuous turn-on signal, which can arise as a limiting case in response to a pulse-width modulated signal, an operational quantity of the load can be detected that can only be detected through an at least short-duration change in the electrical power supplied to the load. An operational quantity of this type is, for example, a current change that arises in response to a change in the electrical power fed to the load.

In this regard, the present invention provides that the continuous turn-on signal is terminated using an interrupt signal and that the continuous turn-on signal is followed by a clock-pulse phase having at least a fundamental period duration of the pulse-width modulated signal, the period including a turn-off time.

The method according to the present invention has the advantage that, on the one hand, the load, in the context of the influencing of the electrical power with the assistance of a pulse-width modulated signal, can be provided with at least approximately full power and, on the other hand, a change in the electrical power of at least short duration arises, the short-duration change being able to be used, for example, for detecting an operational quantity of the load.

A particularly advantageous embodiment of the method according to the present invention provides that a program-controlled signal-processing arrangement, which preferably generates the pulse-width modulated signal, generates the interrupt signal after one program cycle. Using this measure, a simple realization of the program flow sequence is achieved. In particular, the advantage arises that the program running in the signal-processing arrangement brings to bear an influence on the electrical power of the load, upon the generation of the interrupt signal, at exactly the moment at which the program of the signal-processing arrangement expects the effects of the power change. In this manner, an unnecessary halt in the ongoing program flow is avoided.

Another advantageous embodiment provides that the interrupt signal arises due to an external request signal. On the basis of this measure, a controlled termination of a continuous turn-on signal is possible, the external request signal being preferably generated by the arrangement which detects the operational quantity of the load.

Further advantageous embodiments provide that the duration of the clock-pulse phase, which follows the continuous turn-on signal, amounts to a whole-number multiple of the fundamental period duration of the pulse-width modulated signal.

The method according to the present invention makes possible the detecting of a measuring quantity in the area of the turn-off time, which arises during the clock-pulse phase. A measuring quantity of this type is, for example, a change in the current flowing through the load. The current change, at an inductive component located in the circuit, for example, at an inductance-susceptible printed circuit trace of a printed circuit, leads to an inductive voltage drop which is proportional to the current change. Using an integrator, the absolute current can be inferred from the current change.

BRIEF DESCRIPTION OF THE DRAWINGS

FIG. 1 shows a block diagram of a circuit, in which the method according to the present invention is operating.

FIG. 2 shows a segment of a flowchart.

FIG. 3 shows a signal flow pattern assuming the requirement of a continuous turn-on signal.

FIG. 4 shows a time-extended segment of the signal flow pattern depicted in FIG. 3.

DETAILED DESCRIPTION

FIG. 1 depicts a load 10, which is supplied from an energy source 11. Load 10 can be connected to energy source 11 via a switch 12. Switch 12 is driven by a pulse-width modulated signal 13, which is generated by a signal-processing arrangement 14 as a function of a power default signal 15 and a power limiting signal 16. Power limiting signal 16 is made available by a current detector 17, which detects current I flowing through switch 12 and through load 10. The current detector evaluates an induced voltage Ui, which arises at an inductive element 18, through which current I flows. Current detector 17 also delivers a first interrupt signal U1 to signal-processing arrangement 14.

The following method can be realized on the basis of the block diagram depicted in FIG. 1.

Signal-processing arrangement 14, which is preferably program-controlled, generates pulse-width modulated signal 13 as a function of power default signal 15, pulse-width modulated signal 13 either completely switching on or switching off switch 12 in temporal sequence. Pulse-width modulated signal 13 makes available to load 10 an average voltage via switch 12, the voltage being applied from energy source 11. A change in the average voltage made available to load 10 has an effect on average current I flowing through load 10. Pulse-width modulated signal 13, therefore, makes possible to influence the electrical power supplied to load 10. If load 10, for example, is an electromotor, then, using pulse-width modulated signal 13, the speed, for example, can be kept constant at a prescribed value. The detection of the motor current, alternatively, makes it possible to keep constant the torque generated by the electromotor.

The greatest possible power of load 10 arises when switch 12 is continuously turned on by pulse-width modulated signal 13. A continuous turn-on signal of this type, just as a complete turn-off signal, is a special case of pulse-width modulated signal 13. A complete supply of current to load 10, set for an unspecified time, is not possible in all cases. The case of this type arises if an operational quantity of load 10 is to be detected, at which power shows a change at least of short duration. Current detector 17 evaluates an inductive voltage drop Ui, which arises at inductive element 18. The inductive coating of a line carrying current I can be used. A line printed on a printed circuit trace, for example, has sufficient inductance. Induced voltage Ui is proportional to the inductance and to the leakance of current I over time. An integrator contained in the current detector, summing up the current changes, makes available a signal that is proportional to current I. Through a comparison with a preselected threshold value, power limiting signal 16 can be supplied to signal-processing arrangement 14. Power limiting signal 16 signals the presence of an overcurrent and causes signal-processing arrangement 14 to change pulse-width modulated signal 13 right up to entirely turning off load 10.

The power change provided at least for short duration in response to an existing continuous turn-on signal of pulse-width modulated signal 13 is possible according to the present invention as a result of the fact that the continuous turn-on signal is terminated using an interrupt signal and that the continuous turn-on signal is followed by a clock-pulse phase having a least one fundamental period duration including a turn-off time. The interrupt signal, for example, is made available by current detector 17 as external interrupt signal U1.

FIG. 2, in the context of a flowchart, depicts a different possibility for making available the interrupt signal. The interrupt signal arises upon completing a program, which can run, for example, within signal-processing arrangement 14. The program begins with start 21 and proceeds via instructions 22 and queries 23 to instruction 24 at the end of the program, instruction 24 generating a program-generated interrupt signal U2. After instruction 24, a return to start 21 takes place. Pulse-width modulated signal 13 itself can also be generated in the context of the flowchart depicted in FIG. 2. The advantage of realizing program-controlled interrupt signal U2 lies in that program-controlled interrupt signal U2 is made available within the normal program sequence. Intervening in the program, which is necessary in external interrupt signal U1, can be dispensed with.

The effect of the method according to the present invention on the pulse-width modulated signal is illustrated on the basis of the signal flow patterns depicted in FIGS. 3 and 4 as a function of time: FIG. 3 depicts pulse-width modulated signal 13 as a function of time, the ordinate marking "1" signifying that switch 12 is turned on, whereas marking "0" signifies that switch 12 is turned off. Depicted is the operating case in which pulse-width modulated signal 13 arises as a continuous turn-on signal. According to the present invention, it is provided that the continuous turn-on signal is terminated if an interrupt signal U1, U2 arises. This is the case at time points Tu1, Tu2, Tu3. The interrupted continuous turn-on signal has a turn-on duration that is designated in FIG. 3 as Ted. Turn-on duration Ted is followed in each case by clock-pulse phases Tp.

FIG. 4 depicts a clock-pulse phase Tp having a time measure that is enlarged in comparison to FIG. 3. Within clock-pulse phase Tp, at least one turn-off time Ta of pulse-width modulated signal 13 arises. After one turn-off period Ta, pulse-width modulated signal 13 can again be transformed into the continuous signal. Of the fundamental period duration Tg entered in FIG. 4 of pulse-width modulated signal 13, composed of turn-off time Ta and turn-on time Te, only turn-off time Ta would be visible, since then turn-on time Te would already be attributable to the appearance of the continuous turn-on signal. Preferably, in clock-pulse phase Tp, a plurality of fundamental period durations Tg are contained. On the basis of this measure, the advantage is achieved that a sufficient change in the power made available to load can be realized without having to dispense with a comparatively high-frequency clocking. Turn-off time Ta can therefore be maintained at a minimal constant value. A particularly simple realization, from the program-technical point of view, results if clock-pulse phase Tp is a whole-number multiple of fundamental period duration Tg.

What is claimed is:

1. A device for influencing an electrical power of a load, comprising:
   a switch connected in series with the load;
   a signal-processing arrangement for driving the switch in accordance with a pulse-width modulated signal;
   a current detector in communication with the signal-processing arrangement; and
   an inductive element arranged with respect to the current detector, wherein:
      the signal-processing arrangement generates the pulse-width modulated signal right up to a continuous turn-on signal,
      in response to the continuous turn-on signal, the load is completely turned on,
      the current detector evaluates a change over time an induced voltage arising in the inductive element through which a current flows,
      an interrupt signal is generated, and
      the interrupt signal interrupts the continuous turn-on signal at least for a turn-off time of the pulse-width modulated signal.

2. The device according to claim 1, wherein:
   the interrupt signal is made available by a program that runs in the signal-processing arrangement.

3. The device according to claim 1, wherein:
   the interrupt signal is an external signal.

4. The device according to claim 1, wherein:
   the evaluation of the induced voltage is accomplished during the turn-off time of the pulse-width modulated signal.

5. The device according to claim 1, wherein the change over time in the induced voltage is a drop in the induced voltage.

6. The device according to claim 1, wherein the current detector includes an integrator, the integrator determining current changes.

7. The device according to claim 1, wherein the current detector is configured to provide a power limiting signal to the signal processing arrangement as a function of the evaluation.

8. The device according to claim 7, wherein the power limiting signal signals a presence of an overcurrent.

9. A device for influencing an electrical power of a load, comprising:
- a switch connected in series with the load;
- a signal-processing arrangement for driving the switch in accordance with a pulse-width modulated signal;
- a current detector in communication with the signal-processing arrangement; and
- an inductive element arranged with respect to the current detector, wherein:
  - the signal-processing arrangement generates the pulse-width modulated signal right up to a continuous turn-on signal,
  - in response to the continuous turn-on signal, the load is completely turned on,
  - the current detector evaluates an induced voltage arising in the inductive element through which a current flows,
  - an interrupt signal is generated,
  - the interrupt signal interrupts the continuous turn-on signal at least for a turn-off time of the pulse-width modulated signal,
  - the interrupt signal is made available by a program that runs in the signal-processing arrangement, and
  - the interrupt signal is generated after each program cycle.

10. A device for influencing an electrical power of a load, comprising:
- a switch connected in series with the load;
- a signal-processing arrangement for driving the switch in accordance with a pulse-width modulated signal;
- a current detector in communication with the signal-processing arrangement; and
- an inductive element arranged with respect to the current detector, wherein:
  - the signal-processing arrangement generates the pulse-width modulated signal right up to a continuous turn-on signal,
  - in response to the continuous turn-on signal, the load is completely turned on,
  - the current detector evaluates an induced voltage arising in the inductive element through which a current flows,
  - an interrupt signal is generated,
  - the interrupt signal interrupts the continuous turn-on signal at least for a turn-off time of the pulse-width modulated signal, and
  - the interrupt signal interrupts the continuous turn-on signal for a duration of a clock-pulse phase corresponding to a whole-number multiple of a fundamental period duration of the pulse-width modulated signal.

11. A device for influencing an electrical power of a load, comprising:
- a switch connected in series with the load;
- a signal-processing arrangement for driving the switch in accordance with a pulse-width modulated signal;
- a current detector in communication with the signal-processing arrangement; and
- an inductive element arranged with respect to the current detector, wherein:
  - the signal-processing arrangement generates the pulse-width modulated signal right up to a continuous turn-on signal,
  - in response to the continuous turn-on signal, the load is completely turned on,
  - the current detector evaluates an induced voltage arising in the inductive element through which a current flows,
  - an interrupt signal is generated,
  - the interrupt signal interrupts the continuous turn-on signal at least for a turn-off time of the pulse-width modulated signal, and
  - the inductive element corresponds to a printed circuit trace arranged on a printed circuit.

* * * * *